United States Patent
Kwon et al.

(10) Patent No.: US 7,318,879 B2
(45) Date of Patent: Jan. 15, 2008

(54) APPARATUS TO MANUFACTURE SEMICONDUCTOR

(75) Inventors: Tae Yong Kwon, Suwon-si (KR); Jung Wook Kim, Seongnam-Si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 106 days.

(21) Appl. No.: 11/116,224

(22) Filed: Apr. 28, 2005

(65) Prior Publication Data

US 2006/0102283 A1    May 18, 2006

(30) Foreign Application Priority Data

Nov. 12, 2004  (KR) .................. 10-2004-0092544

(51) Int. Cl.
    *H01L 21/306*  (2006.01)
(52) U.S. Cl. ................ 156/345.47; 156/345.43; 118/723 R
(58) Field of Classification Search ........... 118/723 R
    See application file for complete search history.

(56) References Cited

U.S. PATENT DOCUMENTS

| | | | |
|---|---|---|---|
| 6,350,317 B1 * | 2/2002 | Hao et al. ................ | 118/71 |
| 6,527,911 B1 | 3/2003 | Yen et al. | |
| 6,823,815 B2 * | 11/2004 | Han et al. ............... | 118/723 E |
| 6,910,441 B2 * | 6/2005 | Jang ...................... | 118/723 R |
| 6,974,523 B2 * | 12/2005 | Benzing et al. ......... | 156/345.47 |

FOREIGN PATENT DOCUMENTS

| | | | |
|---|---|---|---|
| JP | 11040553 A | * | 2/1999 |
| JP | 2004-063663 | | 2/2004 |
| JP | 2004-072110 | | 3/2004 |
| JP | 2004-088051 | | 3/2004 |
| KR | 1020030090192 A | | 11/2003 |
| KR | 1020030093794 A | | 12/2003 |

* cited by examiner

*Primary Examiner*—Parviz Hassanzadeh
*Assistant Examiner*—Michelle Crowell
(74) *Attorney, Agent, or Firm*—Stanzione & Kim, LLP

(57) ABSTRACT

An apparatus to manufacture a semiconductor includes a plasma-limiting device to limit a plasma region in a reaction chamber. The plasma-limiting device includes a first limiting device to limit the plasma region in the reaction chamber to a first plasma region, a second limiting device to limit the plasma region in the reaction chamber to a second plasma region having an area larger than an area of the first plasma region, and a driving device to simultaneously move the first and second limiting devices to vary the plasma region.

26 Claims, 3 Drawing Sheets

APPARATUS TO MANUFACTURE SEMICONDUCTOR

CROSS-REFERENCE TO RELATED APPLICATIONS

This application claims the benefit under 35 U.S.C. § 119 of Korean Patent Application No. 2004-92544, filed Nov. 12, 2004, in the Korean Intellectual Property Office, the disclosure of which is incorporated herein in its entirety by reference.

BACKGROUND OF THE INVENTION

1. Field of the Invention

The present general inventive concept relates to an apparatus to manufacture a semiconductor, and more particularly, to an apparatus to manufacture a semiconductor having a plasma-limiting device to vary a plasma region.

2. Description of the Related Art

Generally, in an etching process, which is performed when a semiconductor is manufactured, a reactive process gas is supplied to an inside of a reaction chamber in a vacuum state, and then high-frequency power is supplied to the inside of the reaction chamber so as to generate plasma discharge, thereby etching a film formed on a surface of a semiconductor substrate.

The above etching process is performed after a photosensitive pattern is formed on the surface of the semiconductor substrate. After the etching process is performed, a process for removing the unnecessary photosensitive film is performed. A semiconductor having a three-dimensional pattern is formed by repeating the above procedure. In a case in which the above multi-stage etching procedure is performed, volumes of plasma regions in first and second etching processes differ from each other, thereby supplying etching environments suitable for conditions of the first and second etching processes and increasing a removal rate of the photosensitive film in the photosensitive film-removing process.

U.S. Pat. No. 6,527,911 discloses a conventional plasma-limiting device for optimizing a necessary etching process by adjusting the volume of a plasma region. The conventional plasma-limiting device, disclosed by the above Patent, comprises inner plasma limit rings installed close to a semiconductor substrate for limiting the plasma region to an area having a small volume, and an outer plasma limit ring installed at the lower part of the semiconductor substrate for limiting the plasma region to an area having a large volume. When the plasma region in an etching chamber is to be decreased, the plasma region is limited by the inner plasma limit rings, and when the plasma region is to be increased, the plasma region is limited by the outer plasma limit ring.

However, the conventional plasma-limiting device separately comprises a driving device for driving the inner plasma limit rings and a driving device for driving the outer plasma limit ring, thereby having a complicated structure and high production costs.

SUMMARY OF THE INVENTION

Accordingly, the present general inventive concept provides an apparatus to manufacture a semiconductor comprising a plasma-limiting device, which has a simple structure and easily varies a plasma region.

The general inventive concept also provides an apparatus to manufacture a semiconductor, the apparatus comprising a plasma-limiting device, which can limit a plasma region to an area having a small volume, and can limit the plasma region to an area having a large volume, using the same driving device, thereby having a simple structure.

Additional aspects and advantages of the present general inventive concept will be set forth in part in the description which follows and, in part, will be obvious from the description, or may be learned by practice of the general inventive concept.

The foregoing and/or other aspects and advantages of the present general inventive concept may be achieved by providing an apparatus to manufacture a semiconductor, the apparatus comprising a plasma-limiting device to limit a plasma region in a reaction chamber, wherein the plasma-limiting device includes a first limiting device to limit the plasma region in the reaction chamber to a first plasma region, a second limiting device to limit the plasma region in the reaction chamber to a second plasma region having an area larger an area that of the first plasma region, and a driving device to simultaneously move the first and second limiting devices to vary the plasma region.

The apparatus may further comprise a chuck installed in the reaction chamber to support a semiconductor substrate, wherein the first limiting device limits the plasma region to the first plasma region extending to an outer diameter of the chuck, and the second limiting device limits the plasma region to the second plasma region extending from the first plasma region to an upper side portion of the reaction chamber.

The first limiting device may include a plurality of first limiting rings, each of which has an inner diameter larger than the outer diameter of the chuck and an outer diameter smaller than the inner diameter of the reaction chamber, vertically separated from each other and stacked, and connection shafts connecting the plurality of first limiting rings in the separated states such that the connection shafts can move upwards and downwards. The second limiting device may include a second limiting ring having an inner diameter to correspond to the inner diameter of each of the first limiting rings, and an outer diameter larger than the outer diameter of each of the first limiting rings so that the second limiting device is closer to an inner surface of the reaction chamber. The second limiting device may be provided with a plurality of through holes to circulate process gas therethrough. The second limiting ring may be installed at an uppermost portion of the connection shafts of the first limiting device.

The driving device may vertically move the connection shafts.

The plasma region in the reaction chamber may be limited to the first plasma region by the first limiting device when the first and second limiting devices move upwards, and be limited to the second plasma region by the second limiting device when the first and second limiting devices move downwards.

The reaction chamber may include a main body having a cylindrical inner space to form the reaction chamber and a cover to cover an opened upper portion of the main body, and the driving device may be installed on an upper surface of the cover to move the connection shafts upwards and downwards.

The first limiting device may further include spacers to space the first limiting rings.

BRIEF DESCRIPTION OF THE DRAWINGS

These and/or other aspects and advantages of the general inventive concept will become apparent and more readily appreciated from the following description of the embodiments, taken in conjunction with the accompanying drawings in which.

DETAILED DESCRIPTION OF THE PREFERRED EMBODIMENTS

Figure 1:
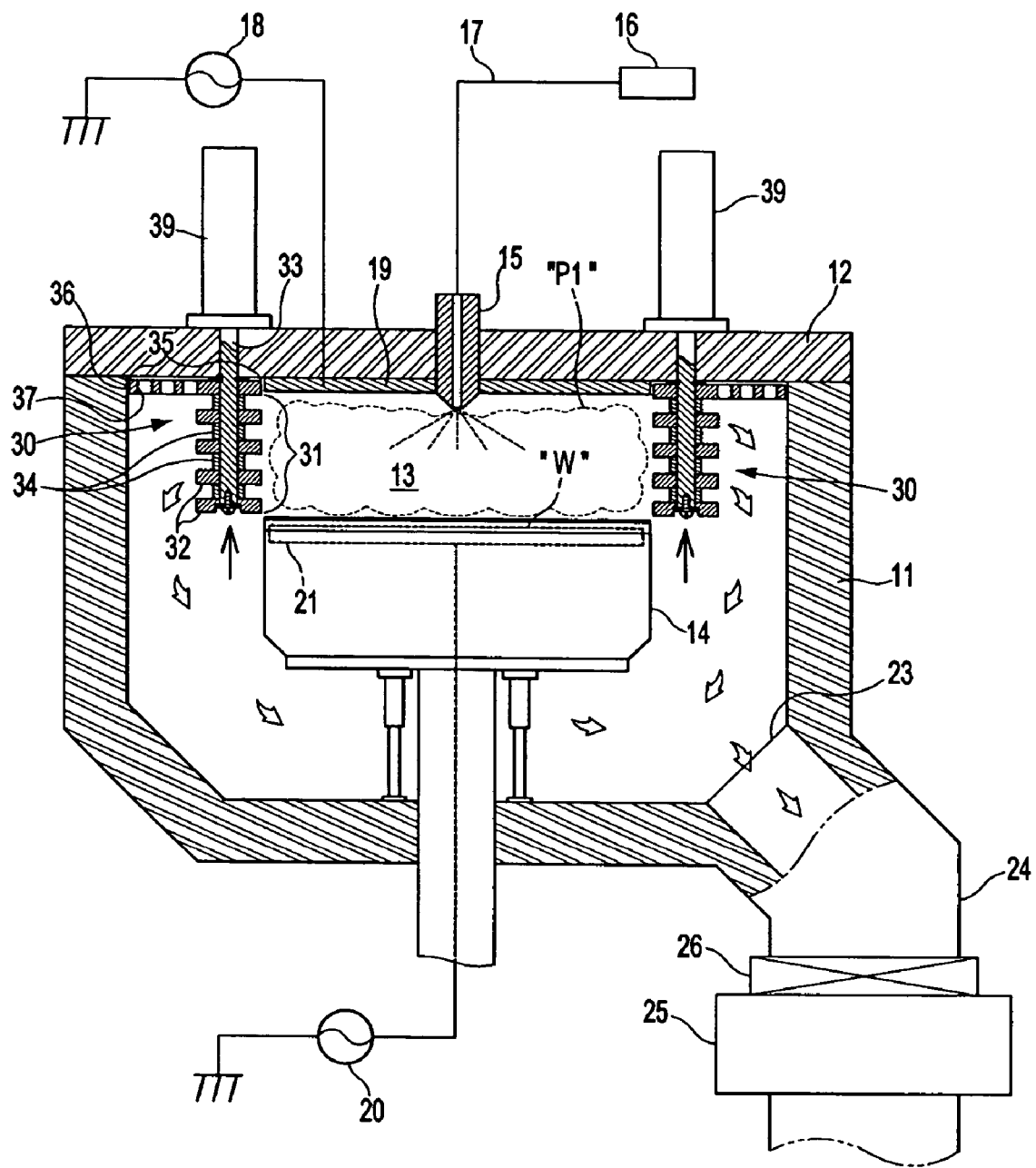
FIG. 1 is a longitudinal sectional view of an apparatus to manufacture a semiconductor according to an embodiment of the present general inventive concept, illustrating a state in which a plasma region is limited to a first plasma region.

Reference will now be made in detail to the embodiment of the present general inventive concept, an example of which is illustrated in the accompanying drawings, wherein like reference numerals refer to like elements throughout. The embodiment is described below to explain the present general inventive concept by referring to the drawings.

Figure 2:
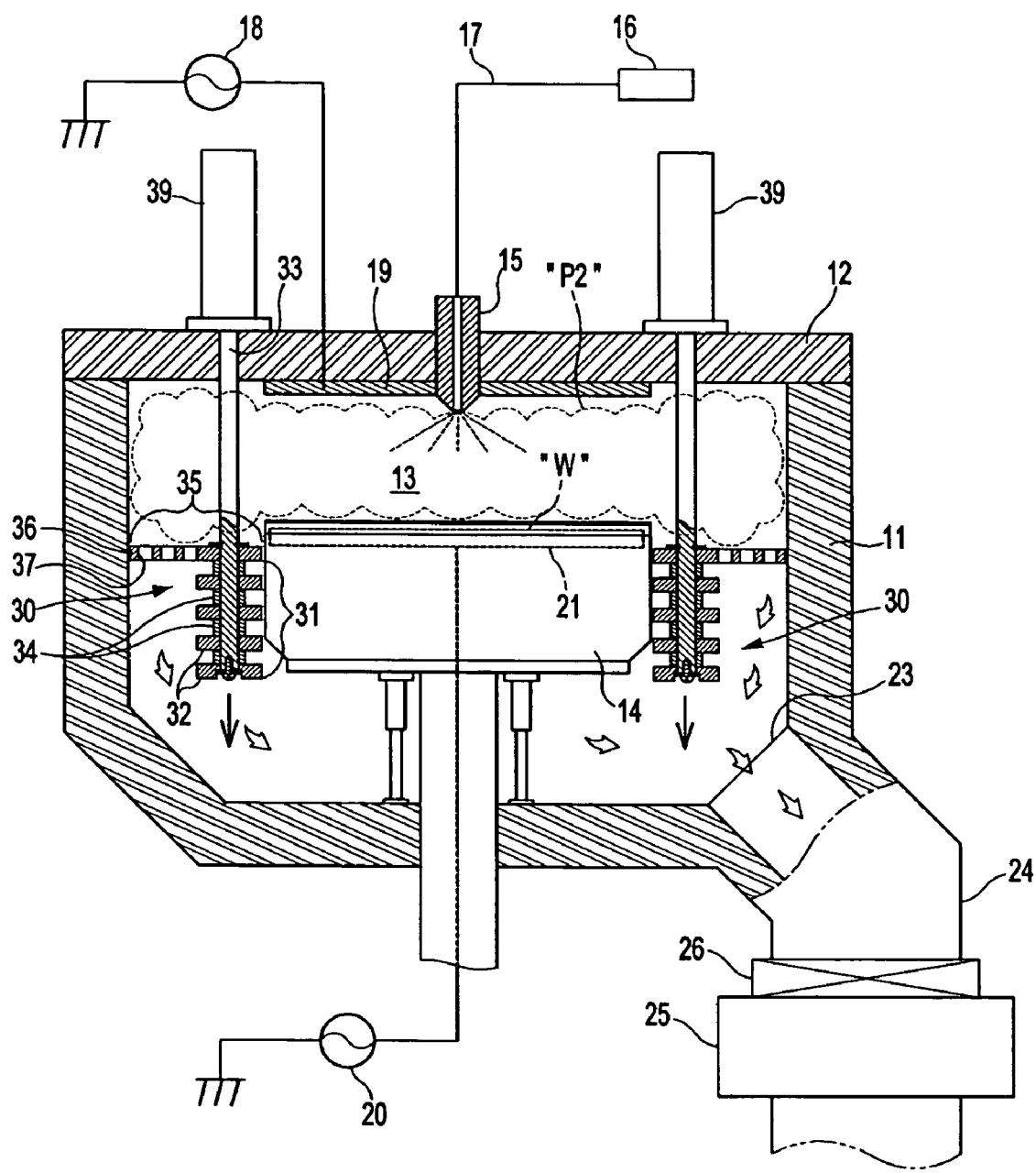
FIG. 2 is a longitudinal sectional view of the apparatus of FIG. 1, illustrating a state in which a plasma region is limited to a second plasma region.

FIGS. 1 and 2 illustrate an apparatus to manufacture a semiconductor according to the present general inventive concept. Referring to FIGS. 1 and 2, the apparatus comprises a reaction chamber 13 to perform fabrication of a semiconductor substrate W therein, including a cylindrical main body 11 having an opened upper surface, and a cover 12 to cover the opened upper surface of the main body 11.

A chuck 14 to support the semiconductor substrate W is installed in the reaction chamber 13, and a gas supply nozzle 15 to supply process gas to an inside of the reaction chamber 13 is installed at a central portion of the cover 12. The gas supply nozzle 15 is connected to a gas supply portion 16 to supply the process gas through a pipe 17. An upper electrode 19, to which radio frequency (RF) power to excite the process gas supplied to the inside of the reaction chamber 13 to a plasma state is applied by an RF power source 18, is installed on the inner surface of the cover 12 above the reaction chamber 13, and a lower electrode 21, to which bias power to guide the process gas in the plasma state to the semiconductor substrate W is applied by a bias power source 20, is installed on the chuck 14.

An outlet 23 to discharge a reaction byproduct and non-reacted gas externally from the reaction chamber 13 is formed through a lower portion of the main body 11. A vacuum pump 25 to maintain an inside of the reaction chamber 13 in a vacuum state, and a pressure control unit 26 are installed in a discharge pipe 24 connected to the outlet 23.

The above apparatus to manufacture a semiconductor is used to perform a depositing process to form a film on a surface of the semiconductor substrate W, or an etching process to etch the film on the surface of the semiconductor substrate W, by adjusting the process gas supplied to the inside of the reaction chamber 13 or other process variables. For example, the depositing process can be performed by supplying silane ($SiH_4$) gas and oxygen gas to the inside of the reaction chamber 13, exciting the gases in the reaction chamber 13 into the plasma state, and adjusting the process variables to be suitable to deposition. The etching process can be performed by supplying methane fluoride ($CHF_3$) gas to the inside of the reaction chamber 13, exciting the gas in the reaction chamber 13 into the plasma state, and adjusting the process variables to be suitable to etching. Process variables in each of the above processes may be a pressure, a temperature, and a time, as well as the process gas.

The etching process is performed after a photosensitive pattern is formed on the semiconductor substrate W, and an unnecessary photosensitive pattern is removed after the etching process is performed. The etching of a three-dimensional pattern on the surface of the substrate W is performed by repeating the above described operations. During the above-described etching process having multiple operations, volumes of plasma regions in a first etching process and a second etching process can be set to different values such that suitable conditions are supplied to the corresponding processes. In order to supply a suitable condition to each of the processes, the apparatus comprises a plasma-limiting device 30 to limit the plasma region in the reaction chamber 13 to a region having a large or small volume.

The plasma-limiting device 30 includes a first limiting device 31 to limit the plasma region in the reaction chamber 13 to a first plasma region (P1) having a small volume, as shown in FIG. 1, a second limiting device 35 to limit (distal end portion) the plasma region in the reaction chamber 13 to a second plasma region (P2) having a volume larger than the volume of the first plasma region (P1), as shown in FIG. 2, and a driving device 39 to simultaneously move the first and second limiting devices 31 and 35 in the reaction chamber 13 upwards and downwards so as to vary the volume of the plasma region.

Figure 3:
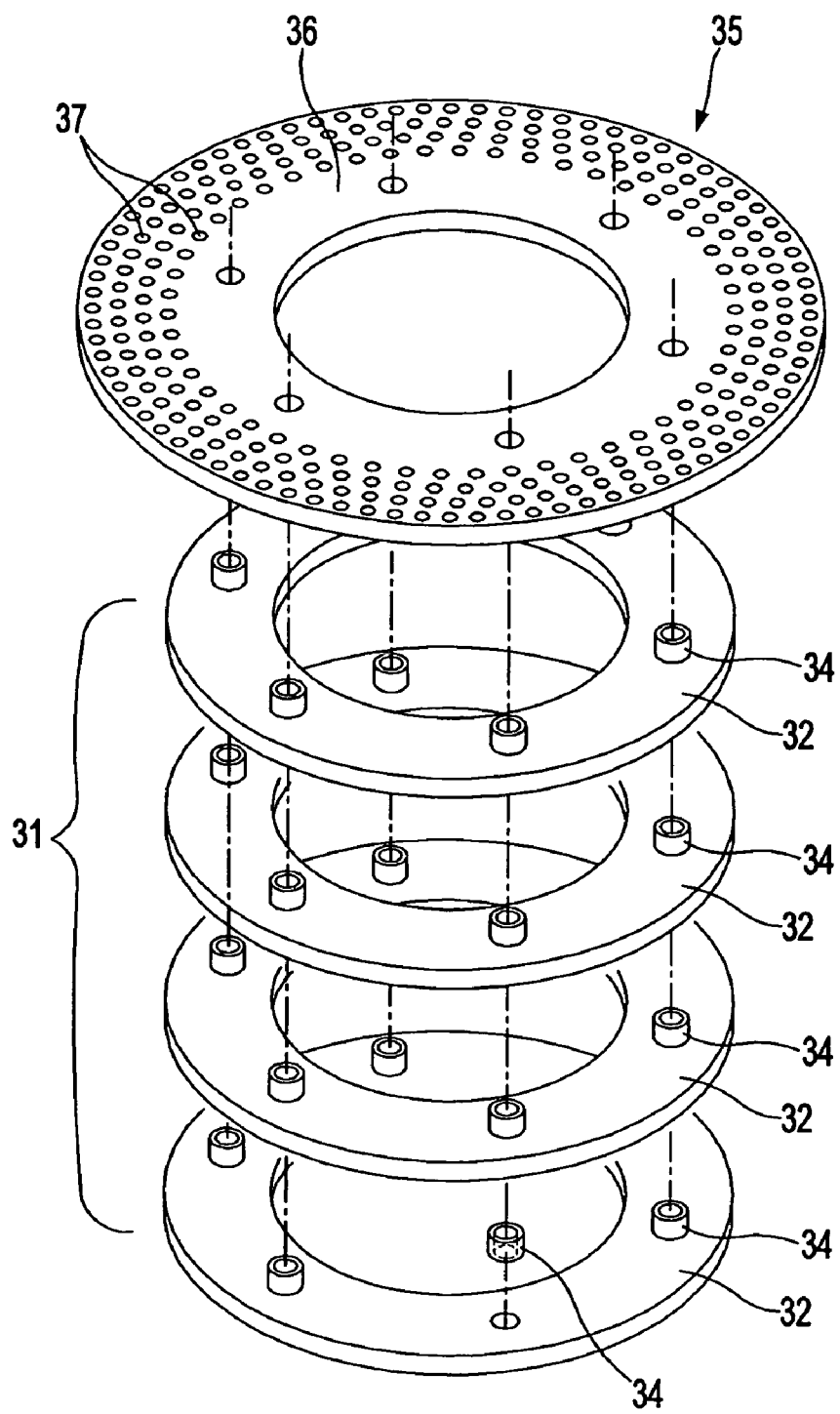
FIG. 3 is an exploded perspective view of first and second limit rings of the apparatus of FIGS. 1 and 2.

FIG. 3 illustrates the first and second limiting devices 31 and 35. Referring to FIGS. 1, 2, and 3, the first limiting device 31 includes a plurality of first limiting rings 32, each of which has an inner diameter larger than an outer diameter of the chuck 14 and an outer diameter smaller than an inner diameter of the reaction chamber 13 (the main body 11), vertically separated from each other and stacked, and connection shafts 33 to connect the first limiting rings 32. The connection shafts 33 pass through the first limiting rings 32. Spacers 34 to space apart the first limiting rings 32 are interposed between the first limiting rings 32. The first limiting rings 32 and the spacers 34 can be made of a material such as quartz or silica.

When the first and second limiting devices 31 and 35 are in an elevated state, as shown in FIG. 1, the first limiting device 31 serves to limit the plasma region to the first plasma region (P1) extending to a position corresponding to the outer diameter of the chuck 14 above the chuck 14. Here, the process gas is excited into the plasma state and is circulated to the outlet 23 through spaces between the first limiting rings 32. When the process gas is circulated through the spaces, the process gas collides with the first limiting rings 32 so that the process gas loses energy and is then neutralized, thereby limiting the plasma region to the first plasma region (P1) inside the first limiting device 31.

The second limiting device 35 includes a second limiting ring 36 installed at an uppermost portion of the connection shafts 33 of the first limiting device 31. An inner diameter of the second limiting ring 36 corresponds to the inner diameter of each of the first limiting rings 32, and an outer diameter of the second limiting ring 36 is larger than the outer diameter of each of the first limiting rings 32 so that the second limiting ring 36 is close to an inner surface of the reaction chamber 13. Here, the outer diameter of the second limiting ring 36, as illustrated in FIG. 2, is nearly identical to the inner diameter of the reaction chamber 13 so that the second limiting ring 36 shields a space between a circumference of the chuck 14 and the inner surface of the main body 11 to limit the plasma region to the second plasma region (P2). A plurality of through holes 37 to circulate the process gas are formed through the second limiting ring 36.

When the first and second limiting devices 31 and 35 are in a lowered state, as shown in FIG. 2, the second limiting device 35 serves to limit the plasma region to the second plasma region (P2) extending from the first plasma region P1 to a side portion of the reaction chamber 13. Here, the process gas is excited into the plasma state and passes through the through holes 37 of the second limiting ring 36. When the process gas passes through the through holes 37, the process gas collides with inner surfaces of the through holes 37 so that the process gas loses energy and is then neutralized, thereby causing an area above the second limiting ring 36 to be used as the second plasma region (P2).

The driving device 39 to move the first and second limiting devices 31 and 35 upwards and downwards can be installed at the upper surface of the cover 12, and the connection shafts 33 to fix the first limiting rings 32 and the second limiting ring 36 can pass through the cover 12 and connect to the driving device 39. This structure causes the first limiting rings 32 and the second limiting ring 36 to move upwards and downwards by an operation of the driving device 39, thereby varying the volume of the plasma region in the reaction chamber 13. That is, the first limiting rings 32 and the second limiting ring 36 are moved upwards and downwards by the same driving device 39. The first and second limiting devices 31 and 35 are simultaneously moved to limit the plasma region to first and second plasma regions (P1 and P2) of different volumes.

Here, the driving device 39 to move the connection shafts 33 upwards and downwards can be a hydraulic cylinder-type driving device, which is operated by a hydraulic pressure, or a solenoid-type driving device, which is operated by power supplied thereto. Although FIGS. 1 and 2 illustrate the driving device 39 as being installed on the upper surface of the cover 12, the driving device 39 may be installed at the lower portion of the main body 11 and the connection shafts 33 may be connected to the driving device 39 installed at the lower portion of the main body 11.

As apparent from the above description, the present general inventive concept provides an apparatus to manufacture a semiconductor comprising a plasma-limiting device having a first limiting device and a second limiting device installed above the first limiting device, in which a plasma region is limited to a first plasma region having a small volume by the first limiting device when the first and second limiting devices move upwards, and the plasma region is limited to a second plasma region having a large volume by the second limiting device when the first and second limiting devices move downwards, thereby easily varying the volume of the plasma region.

Further, the apparatus according to the present general inventive concept is configured such that the first limiting device to limit the plasma region to an area having a small volume and the second limiting device to limit the plasma region to an area having a large volume are vertically moved by the same driving device, thereby having simple a structure.

Although an embodiment of the general inventive concept has been shown and described, it would be appreciated by those skilled in the art that changes may be made in this embodiment without departing from the principles and spirit of the general inventive concept, the scope of which is defined in the claims and their equivalents.

What is claimed is:

1. An apparatus to manufacture a semiconductor, the apparatus comprising a plasma-limiting device to limit a plasma region in a reaction chamber, the plasma-limiting device including:
   a first limiting device to limit the plasma region in the reaction chamber to a first plasma region;
   a second limiting device to limit the plasma region in the reaction chamber to a second plasma region having an area larger than an area of the first plasma region; and
   a driving device to simultaneously move the first and second limiting devices to vary the plasma region to one of the first plasma region and the second plasma region.

2. The apparatus as set forth in claim 1, further comprising:
   a chuck installed in the reaction chamber to support a semiconductor substrate,
   wherein the first limiting device limits the plasma region to the first plasma region extending above the chuck to a position corresponding to an outer diameter of the chuck, and the second limiting device limits the plasma region to the second plasma region extending outward from the first plasma region to a side portion of the reaction chamber.

3. The apparatus as set forth in claim 2, wherein:
   the first limiting device comprises a plurality of first limiting rings, each of which has an inner diameter larger than the outer diameter of the chuck and an outer diameter smaller than an inner diameter of the reaction chamber, vertically separated from each other and stacked, and connection shafts connecting the first limiting rings in the separated states such that the connection shafts are moveable upwards and downwards;
   the second limiting device comprises a second limiting ring having an inner diameter to correspond to the inner diameter of each of the first limiting rings, and an outer diameter larger than the outer diameter of each of the first limiting rings so that the second limiting device is closer to an inner surface of the reaction chamber, and the second limiting ring having a plurality of through holes to circulate process gas formed therethrough; and
   the second limiting ring is installed at a portion of the connection shafts of the first limiting device.

4. The apparatus as set forth in claim 3, wherein the driving device vertically moves the connection shafts.

5. The apparatus as set forth in claim 4, wherein the plasma region in the reaction chamber is limited to the first plasma region by the first limiting device when the first and second limiting devices move upwards, and is limited to the second plasma region by the second limiting device when the first and second limiting devices move downwards.

6. The apparatus as set forth in claim 4, wherein:
   the reaction chamber comprises a main body having a cylindrical inner space formed therein, and a cover to cover an opened upper portion of the main body; and
   the driving device is installed at the cover to move the connection shafts upwards and downwards.

7. The apparatus as set forth in claim 3, wherein the first limiting device further includes spacers to space apart the first limiting rings.

8. The apparatus as set forth in claim 1, wherein the driving device comprises one of a hydraulic cylinder driving device and a solenoid driving device.

9. An apparatus to manufacture a semiconductor, comprising:
   a reaction chamber to process a semiconductor substrate;
   a plasma limiting device to control a volume of a plasma area within the reaction chamber, comprising:
   a plurality of first limiting rings vertically spaced apart to limit the plasma area to a first volume,
   a second limiting ring larger than each of the plurality of first limiting rings and disposed above the plurality of first limiting rings to limit the plasma area to a second volume larger than the first volume, and
one or more connection shafts to connect the plurality of first limiting rings together and to the second limiting rings; and
a driving device to raise and lower the one or more connection shafts.

10. The apparatus as set forth is claim 9, wherein when the driving device raises the one or more connection shafts the plurality of first limiting rings limits the plasma area to the first volume, and when the driving device lowers the one or more connection shafts, the second limiting ring limits the plasma area to the second volume.

11. The apparatus as set forth in claim 9, wherein the plurality of first limiting rings limit the plasma area to an area within an outer perimeter of the substrate extending above the substrate when the one or more connection shaft is raised by the driving device.

12. The apparatus as set forth in claim 9, wherein the second limiting ring limits the plasma area to an area above the substrate extending outwards to an inner surface of the reaction chamber.

13. An apparatus to manufacture a semiconductor, comprising:
a reaction chamber;
a chuck provided in the reaction chamber to support a semiconductor substrate;
a plasma-limiting device comprising first and second plasma-limiting devices disposed between the chuck and an inside surface of the reaction chamber to move the first and second plasma limiting devices to selectively define a first plasma region and a second plasma region by the first plasma limiting device and the second plasma limiting device, respectively.

14. The apparatus as set forth in claim 13, wherein the plasma-limiting device is inserted around the chuck.

15. The apparatus as set forth in claim 13, wherein the plasma-limiting device comprises:
a first limiting device to form the first plasma region when the plasma-limiting device moves to the first position; and
a second limiting device to form the second plasma region when the plasma-limiting device moves to the second position.

16. The apparatus as set forth in claim 15, wherein the first plasma region is formed by a surface of the chuck, a first portion of the inside surface of the reaction chamber, and the first limiting device, and the second plasma region is formed by the surface of the chuck a second portion of the inside surface of the reaction chamber, and the second limiting device.

17. The apparatus as set forth in claim 15, wherein the first limiting device and the second limiting device move simultaneously.

18. The apparatus as set forth in claim 13, wherein the plasma-limiting device comprises:
a driving device;
a shaft connected to the driving device and disposed around the chuck;
a first limiting device connected to the shaft to form the first plasma region with a surface of the chuck and a first portion of the inside surface of the reaction chamber; and
a second limiting device connected to the shaft to form the second plasma region with the surface of the chuck and a second portion of the inside surface of the reaction chamber.

19. The apparatus as set forth in claim 13, wherein the plasma-limiting device comprises:
a driving device;
a shaft to move according to a power from the driving device;
a first limiting device connected to a first portion of the shaft, and having a first ring shape to be disposed between a first portion of the inside surface of the reaction chamber and the chuck to form the first plasma region when the plasma-limiting device is in the first position; and
a second limiting device connected to a second portion of the shaft, and having a second ring shape to be disposed between a second portion of the inside surface of the reaction chamber and the chuck to form the second plasma region when the plasma-limiting device is in the second position.

20. The apparatus as set forth in claim 19, wherein the first limiting device comprises a plurality of plates spaced apart along the shaft to form a space through which the first plasma region communicates with a third region of the reaction chamber.

21. The apparatus as set forth in claim 19, wherein the second limiting device comprises a plurality of holes through which the second plasma region communicates with a third region of the reaction chamber.

22. The apparatus as set forth in claim 19, wherein the first limiting device is not disposed in the first and second plasma regions when the second limiting device forms the second plasma region with the second portion of the inside surface of the reaction chamber and the chuck.

23. An apparatus to manufacture a semiconductor, comprising:
a chuck;
a first limiting device disposed adjacent to the chuck to define a first plasma region with the chuck; and
a second limiting device disposed around the first limiting device to define a second plasma region with the chuck and the first limiting device and disposed outside the first plasma region, the first limiting device and the second limiting device moving together to define one of the first plasma region and the second plasma region.

24. The apparatus of claim 23, further comprising:
a driving device to simultaneously move the first limiting device and the second limiting device with respect to the chuck to define one of the first plasma region and the second plasma region.

25. The apparatus of claim 23, further comprising:
a driving device to move the first limiting device and the second limiting device to define one of the first plasma region and the second plasma region.

26. The apparatus of claim 23, wherein the first limiting device comprises a first surface disposed in a moving direction to define the first plasma region and the second limiting device comprises a second surface disposed in a direction having an angle with the moving direction to define the second plasma region.

* * * * *